United States Patent
An et al.

(10) Patent No.: US 9,634,035 B2
(45) Date of Patent: Apr. 25, 2017

(54) DISPLAY DEVICE AND METHOD OF MANUFACTURING THE SAME

(71) Applicant: Samsung Display Co., Ltd., Yongin-si, Gyeonggi-do (KR)

(72) Inventors: Jin Sung An, Yongin-si (KR); Moo Soon Ko, Yongin-si (KR); Jeong Soo Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/960,230

(22) Filed: Dec. 4, 2015

(65) Prior Publication Data

US 2016/0218117 A1    Jul. 28, 2016

(30) Foreign Application Priority Data

Jan. 22, 2015    (KR) ........................ 10-2015-0010788

(51) Int. Cl.
| | | |
|---|---|---|
| *H01L 29/12* | (2006.01) | |
| *H01L 21/00* | (2006.01) | |
| *H01L 27/12* | (2006.01) | |
| *H01L 27/13* | (2006.01) | |
| *H01L 29/66* | (2006.01) | |
| *H01L 29/786* | (2006.01) | |
| *H01L 51/05* | (2006.01) | |

(52) U.S. Cl.
CPC ........ *H01L 27/124* (2013.01); *H01L 27/1255* (2013.01); *H01L 27/1262* (2013.01); *H01L 27/12* (2013.01); *H01L 27/13* (2013.01); *H01L 29/66757* (2013.01); *H01L 29/78621* (2013.01); *H01L 51/0541* (2013.01)

(58) Field of Classification Search
CPC ... H01L 27/12; H01L 27/124; H01L 27/1214; H01L 27/1255; H01L 27/1262; H01L 27/13; H01L 21/775; H01L 29/66757; H01L 29/78621; H01L 51/0545; H01L 51/0541
USPC ........ 257/71, 72, 59, 40, E29.003, E21.003; 438/48, 128, 149, 151, 157, 183
See application file for complete search history.

(56) References Cited

U.S. PATENT DOCUMENTS

| | | | |
|---|---|---|---|
| 2003/0053005 A1 | 3/2003 | Song et al. | |
| 2010/0065840 A1* | 3/2010 | Yamazaki | G02F 1/1368 257/43 |
| 2010/0295758 A1 | 11/2010 | Kawabe | |
| 2014/0034923 A1 | 2/2014 | Kim et al. | |

FOREIGN PATENT DOCUMENTS

| | | |
|---|---|---|
| KR | 10-0756251 B1 | 9/2007 |
| KR | 10-2014-0018623 A | 2/2014 |

* cited by examiner

*Primary Examiner* — Thinh T Nguyen
(74) *Attorney, Agent, or Firm* — Lewis Roca Rothgerber Christie LLP

(57) ABSTRACT

A display device includes: a first wiring line and a second wiring line separated from each other on a substrate; a gate insulating layer on the first wiring line and the second wiring line; a step difference compensation pattern between the first wiring line and the second wiring line on the gate insulating layer; a protective layer on the step difference compensation pattern; and a pixel electrode on the protective layer.

8 Claims, 5 Drawing Sheets

DISPLAY DEVICE AND METHOD OF MANUFACTURING THE SAME

CROSS-REFERENCE TO RELATED APPLICATION

This application claims priority to and the benefit of Korean Patent Application No. 10-2015-0010788, filed on Jan. 22, 2015, in the Korean Intellectual Property Office, the entire content of which is incorporated herein by reference in its entirety.

BACKGROUND

1. Field

Aspects of embodiments of present invention relate to a display device and a method of manufacturing the same.

2. Description of the Related Art

Display devices that display various information items on a screen as a core technology of an information communication age have become thinner, lighter, and portable and have increased in performance. As a display device capable of reducing a weight and a volume compared to a cathode ray tube (CRT), an organic light emitting display that controls an amount of light emission of an organic light emitting layer to display an image has increased in popularity.

The OLED includes a plurality of pixels including organic light emitting diodes (OLED) that are self-emission elements. In each pixel, a plurality of thin film transistors (TFT) and a capacitor for driving an OLED are formed. In addition, each pixel includes a gate wiring line and a data wiring line for driving the TFTs.

The plurality of TFTs may include a switching TFT and a driving TFT and may further include a TFT for compensating for a threshold voltage.

The above information discussed in this Background section is only for enhancement of understanding of the background of the described technology and therefore it may contain information that does not constitute prior art.

SUMMARY

Aspects of embodiments of the present invention relate to a display device capable of compensating for step difference of a gate insulating layer to improve reliability and a method of manufacturing the same.

According to example embodiments of the present invention, a display device includes:

According to some example embodiments of the present invention, a display device includes: a first wiring line and a second wiring line separated from each other on a substrate; a gate insulating layer on the first wiring line and the second wiring line; a step difference compensation pattern between the first wiring line and the second wiring line on the gate insulating layer; a protective layer on the step difference compensation pattern; and a pixel electrode on the protective layer.

The step difference compensation pattern may be in a floating state.

A thickness of the step difference compensation pattern may be equal to a thickness of the first wiring line and a thickness of the second wiring line.

The step difference compensation pattern may have a thickness in a range of 2,500 Å to 3,500 Å.

The display device may further include a storage capacitor on the gate insulating layer.

The storage capacitor may include: an upper storage electrode on the gate insulating layer and formed of a same material as the step difference compensation pattern; and a lower storage electrode under the gate insulating layer and overlapping the upper storage electrode.

The first wiring line may include a scan wiring line configured to transmit a scan signal and the second wiring line may include an emission control line configured to transmit an emission control signal.

The gate insulating layer may include an inorganic insulating material.

According to some example embodiments of the present invention, in a method of manufacturing a display device, the method includes: forming a first wiring line and a second wiring line separated from the first wiring line on a substrate; forming a step difference compensation pattern between the first wiring line and the second wiring line on the gate insulating layer; forming a protective layer on an entire surface of the substrate on which the step difference compensation pattern is formed; and forming a pixel electrode on the protective layer.

The step difference compensation pattern may be in a floating state.

A thickness of the step difference compensation pattern may be equal to a thickness of the first wiring line and a thickness of the second wiring line.

The step difference compensation pattern may have a thickness in a range of 2,500 Å to 3,500 Å.

The first wiring line may include a scan wiring line configured to transmit a scan signal and the second wiring line may include an emission control line configured to transmit an emission control signal.

The gate insulating layer may include an inorganic insulating material.

The method may further include forming an insulating layer between the substrate and the first and second wiring lines.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be more thorough and more complete, and will more fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
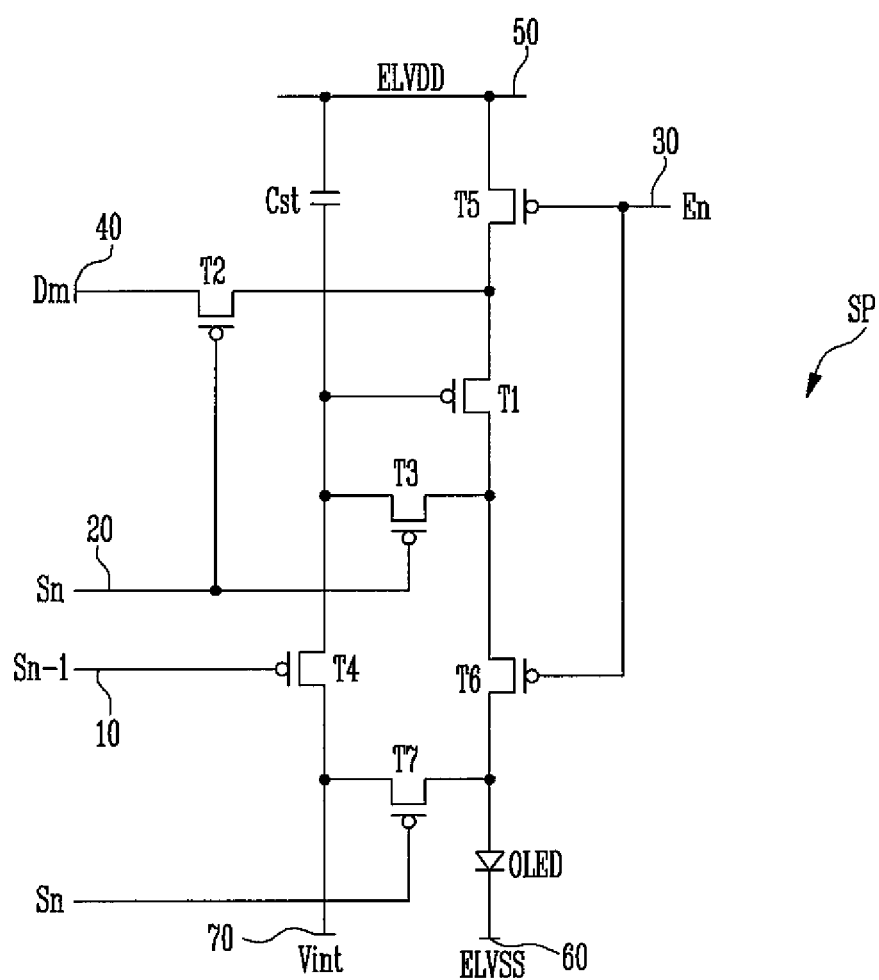
FIG. 1 is an equivalent circuit diagram of one sub pixel in a display device according to an embodiment of the present invention.

Example embodiments will now be described more fully hereinafter with reference to the accompanying drawings; however, they may be embodied in different forms and should not be construed as limited to the embodiments set forth herein. Rather, these embodiments are provided so that this disclosure will be more thorough and more complete, and will more fully convey the scope of the example embodiments to those skilled in the art. Accordingly, processes, elements, and techniques that are not necessary to those having ordinary skill in the art for a complete understanding of the aspects and features of the present invention may not be described.

Like reference numerals refer to like elements throughout. In the drawing figures, dimensions may be exaggerated for clarity of illustration.

It will also be understood that when an element is referred to as being "on" another element, it can be directly on the other element, or intervening elements may also be present, unless otherwise specified.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "connected to," or "coupled to" another element or layer, it can be directly connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Figure 2:
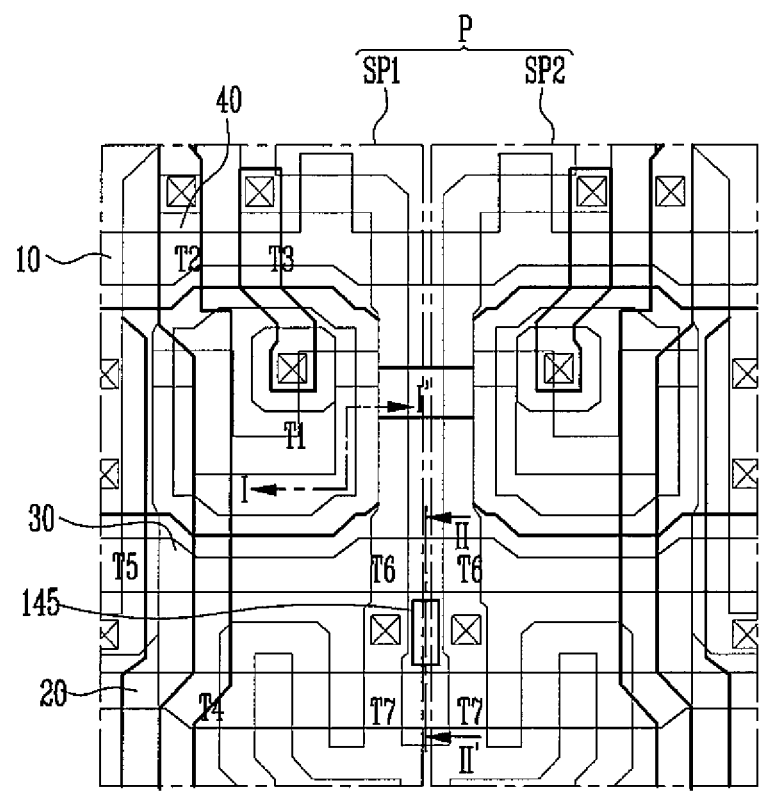
FIG. 2 is view schematically illustrating positions of a plurality of thin film transistors (TFT) and capacitors of a display device according to an embodiment of the present invention.

FIG. 1 is an equivalent circuit diagram of one sub pixel in a display device according to an embodiment of the present invention and FIG. 2 is view schematically illustrating positions of a plurality of thin film transistors (TFT) and a capacitor of a display device according to an embodiment of the present invention.

Referring to FIGS. 1 and 2, one sub pixel SP of the display device according to the embodiment of the present invention includes a plurality of signal lines, first to seventh TFTs T1 to T7 coupled to the plurality of signal lines, a storage capacitor Cst, and an organic light emitting diode (OLED).

The first TFT T1 is a driving TFT, a second TFT T2 is a switching TFT, a third TFT T3 is a compensation TFT, a fourth TFT T4 is a first initialization TFT, a fifth TFT T5 is an operation control TFT, a sixth TFT T6 is an emission control TFT, and a seventh TFT T7 is a second initialization TFT.

The signal lines include a scan line 20 for transmitting a scan signal Sn, a previous scan line 10 for transmitting a previous scan signal Sn-1 to the fourth TFT T4, an emission control line 30 for transmitting an emission control signal En to the fifth TFT T5 and the sixth TFT T6, a data wiring line 40 that intersects the scan line 20 to transmit a data signal Dm, a driving voltage line 50 formed to run parallel (or almost parallel) with the data wiring line 40 to transmit a driving voltage ELVDD, an initialization voltage line 70 for transmitting an initialization voltage Vint for initializing the first TFT T1, and a common voltage line 60 coupled to a cathode of the OLED.

A gate electrode of the first TFT T1 is coupled to one end of the storage capacitor Cst, a source electrode of the first TFT T1 is coupled to the driving voltage line 50 via the fifth TFT T5, and a drain electrode of the first TFT T1 is electrically coupled to an anode of the OLED via the sixth TFT T6.

The first TFT T1 receives the data signal Dm in accordance with a switching operation of the second TFT T2 to supply a driving current to the OLED.

A gate electrode of the second TFT T2 is coupled to the scan line 20, a source electrode of the second TFT T2 is coupled to the data wiring line 40, and a drain electrode of the second TFT T2 is coupled to the source electrode of the first TFT T1 and is coupled to the driving voltage line 50 via the fifth TFT T5.

A gate electrode of the third TFT T3 is coupled to the scan line 20, a source electrode of the third TFT T3 is coupled to the drain electrode of the first TFT T1 and is coupled to the anode of the OLED via the sixth TFT T6, and a drain electrode of the third TFT T3 is coupled to one end of the storage capacitor Cst, a drain electrode of the fourth TFT T4, and the gate electrode of the first TFT T1.

The third TFT T3 is turned on in accordance with the scan signal Sn received through the scan line 20 to couple the gate electrode and drain electrode of the first TFT T1 and to diode-couple the first TFT T1.

A gate electrode of the fourth TFT T4 is coupled to the previous scan line 10, a source electrode of the fourth TFT T4 is coupled to the initialization voltage line 70, and a drain electrode of the fourth TFT T4 is coupled to one end of the storage capacitor Cst, the drain electrode of the third TFT T3, and the gate electrode of the first TFT T1. The fourth TFT T4 is turned on in accordance with the previous scan signal Sn-1 received through the previous scan line 10 to transmit the initialization voltage Vint to the gate electrode of the first TFT T1 and to initialize a voltage of the gate electrode of the first TFT T1.

At this time, the third TFT T3 and the fourth TFT T4 may have a dual structure.

A gate electrode of the fifth TFT T5 is coupled to the emission control line 30, a source electrode of the fifth TFT T5 is coupled to the driving voltage line 50, and a drain electrode of the fifth TFT T5 is coupled to the source electrode of the first TFT T1 and the drain electrode of the second TFT T2.

A gate electrode of the sixth TFT T6 is coupled to the emission control line 30, a source electrode of the sixth TFT T6 is coupled to the drain electrode of the first TFT T1 and the source electrode of the third TFT T3, and a drain electrode of the sixth TFT T6 is electrically coupled to the anode of the OLED.

The fifth TFT T5 and the sixth TFT T6 are concurrently (e.g., simultaneously) turned on in accordance with the emission control signal En received through the emission control line 30 to transmit the driving voltage ELVDD to the OLED so that the driving current flows through the OLED.

A gate electrode of the seventh TFT T7 is coupled to the scan line 20, a source electrode of the seventh TFT T7 is coupled to the source electrode of the fourth TFT T4, and a drain electrode of the seventh TFT T7 is coupled to a node formed between the sixth TFT T6 and the OLED. The seventh TFT T7 is turned on in accordance with the scan signal Sn received through the scan line 20 to initialize the OLED charged in a previous frame.

The other end of the storage capacitor Cst is coupled to the driving voltage line 50 and the cathode of the OLED is coupled to the common voltage line 60. Therefore, the OLED receives the driving current from the first TFT T1 and emits light to display an image.

Figure 3:
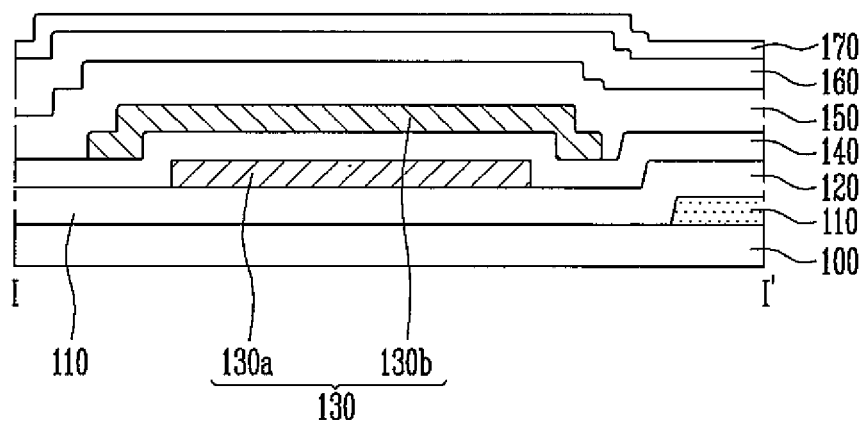
FIG. 3 is a cross-sectional view taken along the line I-I' of the display device of FIG. 2.

As illustrated in FIG. 3, the storage capacitor Cst includes a lower storage electrode 130a and an upper storage electrode 130b formed on a substrate 100 and a gate insulating layer 140 that functions as a dielectric material is formed between the lower storage electrode 130a and the upper storage electrode 130b.

A semiconductor layer 110 and an insulating layer 120 may be formed between the substrate 100 and the lower storage electrode 130a. A first protective layer 150, a second protective layer 160, and a pixel electrode 170 may be sequentially formed on the upper storage electrode 130b.

The lower storage electrode 130a, the gate insulating layer 140, and the upper storage electrode 130b that are sequentially stacked form a storage capacitor Cst 130.

Hereinafter, operation processes of one sub pixel SP of the display device according to the embodiment of the present invention will be described in more detail.

First, in an initialization period, the previous scan signal Sn-1 at a low level is supplied through the previous scan line 10. Then, the fourth TFT T4 is turned on in response to the previous scan signal Sn-1 at the low level, the initialization voltage Vint from the initialization voltage line 70 is connected to the gate electrode of the first TFT T1 through the fourth TFT T4, and the first TFT T1 is initialized by the initialization voltage Vint.

Then, in a data programming period, the scan signal Sn at a low level is supplied through the scan line 20. Then, the second TFT T2 and the third TFT T3 are turned on in response to the scan signal Sn at the low level. At this time, the first TFT T1 is diode-coupled by the turned on third TFT T3 and is forward biased. Then, a compensation voltage obtained by subtracting a threshold voltage Vth of the first TFT T1 from the data signal Dm supplied from the data wiring line 40 is applied to the gate electrode of the first TFT T1.

The driving voltage ELVDD and the compensation voltage are applied to both ends of the storage capacitor Cst. Charges corresponding to a voltage difference between the both ends of the storage capacitor Cst are stored in the storage capacitor Cst. Then, in an emission period, the emission control signal En supplied from the emission control line 30 is transitioned from a high level to a low level. Then, in the emission period, the fifth TFT T5 and the sixth TFT T6 are turned on by the emission control signal En at the low level.

Then, the driving current is generated in accordance with a voltage difference between the voltage of the gate electrode of the first TFT T1 and the driving voltage ELVDD and is supplied to the OLED OLED through the sixth TFT T6. In the emission period, a gate-source voltage of the first TFT T1 is maintained as a difference voltage between the compensation voltage and the driving voltage ELVDD by the storage capacitor Cst. In accordance with a current-voltage relationship of the first TFT T1, the driving current is proportional to a square of a value obtained by subtracting the threshold voltage from the source-gate voltage. Therefore, a first current is determined regardless of the threshold voltage of the first TFT T1.

On the other hand, the seventh TFT T7 is turned on by the scan signal Sn supplied from the scan line 20 to initialize the OLED charged in a previous frame.

The sub pixel SP having such a structure may form a pixel region P in which two adjacent first and second sub pixels (SP1 and SP2 of FIG. 2) include one emission region. A step difference compensation pattern 145 is formed between the sixth TFT T6 and the seventh TFT T7 respectively included in the first and second sub pixels SP1 and SP2 that form the pixel region P.

For example, the step difference compensation pattern 145 is positioned on a boundary between the first and second sub pixels SP1 and SP2 between the emission control line 30 and the scan line 20 in a vertical direction to compensate for a step difference of the gate insulating layer 140 generated due to thickness of the emission control line 30 and thickness of the scan line 20.

Therefore, on the boundary between the first and second sub pixels SP1 and SP2, because the sixth TFTs T6 coupled to the emission control line 30 are formed after the step difference is compensated for by the step difference compensation pattern 145, additional step difference is not generated.

On the boundary between the first and second sub pixels SP1 and SP2, because the seventh TFTs T7 coupled to the scan line 20 are formed after the step difference is compensated for by the step difference compensation pattern 145, additional step difference is not generated.

When the step difference is compensated for by the step difference compensation pattern 145, it may be possible to prevent or reduce instances of TFTs or a wiring line formed on the emission control line 30 and the scan line 20 in a subsequent process from being shorted.

Figure 4:
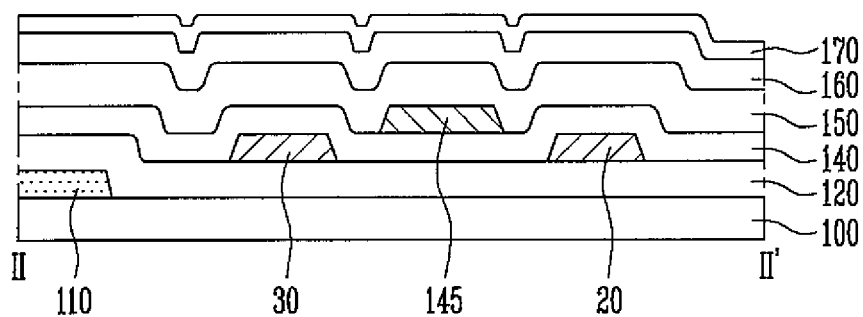
FIG. 4 is a cross-sectional view taken along the line II-II' of the display device of FIG. 2.

FIG. 4 is a cross-sectional view taken along the line II-II' of the display device of FIG. 2.

Referring to FIGS. 2 and 4, the display device includes the substrate 100, the semiconductor layer 110 formed on the substrate 100, the insulating layer 120 formed on the semiconductor layer 110, the emission control line 30 and the scan line 20 separated from each other by a uniform distance on the insulating layer 120, the gate insulating layer 140 formed on the emission control line 30 and the scan line 20, the step difference compensation pattern 145 formed on the gate insulating layer 140, the first protective layer 150 and the second protective layer 160 sequentially formed on the step difference compensation pattern 145, and the pixel electrode 170 formed on the second protective layer 160.

The gate insulating layer 140 is a single inorganic insulating layer such as a Si oxide layer, a Si oxide/nitride layer, a Si nitride/oxide layer, a Si nitride layer, and a Ta oxide layer or is formed by stacking or layering inorganic insulating layers such as a Si oxide layer, a Si oxide/nitride layer, a Si nitride/oxide layer, a Si nitride layer, and a Ta oxide layer.

The step difference compensation pattern 145 is formed on the gate insulating layer 140 between the emission control line 30 and the scan line 20. That is, the step difference compensation pattern 145 does not overlap the emission control line 30 and the scan line 20. The step difference compensation pattern 145 has the same thickness as that of the emission control line 30 and that of the scan line 20. The thickness may be about 2,500 Å to 3,500 Å and according to some embodiments may be about 3,000 Å.

The step difference compensation pattern 145 is formed in the same layer as the upper storage electrode (130b of FIG. 3) and may be formed of the same material as the upper storage electrode (130b of FIG. 3).

Because no wiring line is formed between the emission control line 30 and the scan line 20, the gate insulating layer 140 directly formed on the emission control line 30 and the scan line 20 includes the step difference generated along the emission control line 30 and the scan line 20. The step difference compensation pattern 145 is formed on the gate insulating layer 140 between the emission control line 30 and the scan line 20 to compensate for the step difference of the gate insulating layer 140.

Hereinafter, a method of manufacturing the display device having the above-described structure according to the embodiment of the present invention will be described.

FIGS. 5A to 5I are cross-sectional views sequentially illustrating a method of manufacturing the display device of FIG. 4.

Figure 5A:
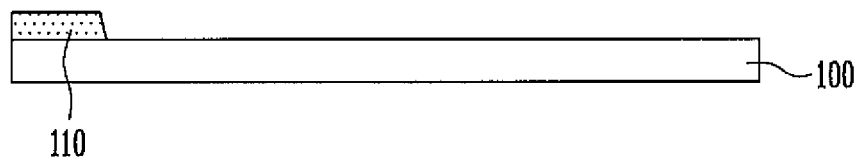
FIGS. 5A to 5I are cross-sectional views sequentially illustrating a method of manufacturing the display device of FIG. 4.

Referring to FIG. 5A, the semiconductor layer 110 is formed on the substrate 100. The substrate 100 may be any suitable substrate material for forming a device and may have high mechanical strength or size stability. The material of the substrate 100 may be, for example, a glass plate, a metal plate, a ceramic plate, or plastic (polycarbonate resin, polyester resin, epoxy resin, silicon resin, or fluoride resin). However, the present invention is not limited thereto. The semiconductor layer 110 may include an amorphous silicon material and an impurity amorphous silicon material or an oxide semiconductor material.

Figure 5B:
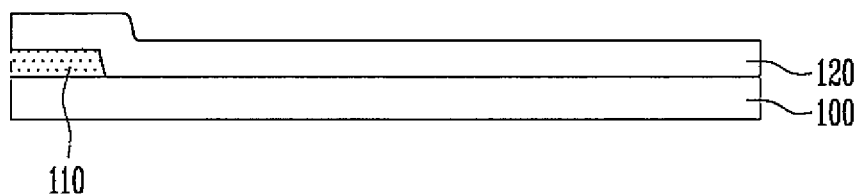

Referring to FIG. 5B, the insulating layer 120 is formed on an entire surface of the substrate 100 on which the semiconductor layer 110 is formed, and may extend across the semiconductor layer 110. The insulating layer 120 may be formed of an inorganic insulating layer such as a Si oxide layer, a Si oxide/nitride layer, a Si nitride/oxide layer, a Si nitride layer, and a Ta oxide layer.

Figure 5C:
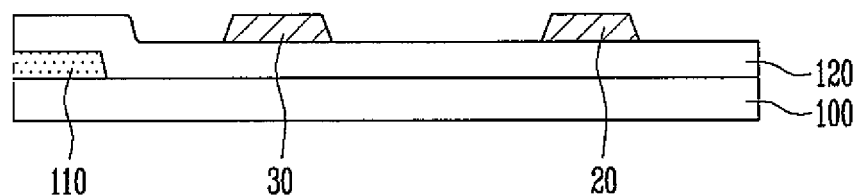

Referring to FIG. 5C, the emission control line 30 and the scan line 20 separated from each other by a uniform distance are formed on the insulating layer 120.

The emission control line 30 and the scan line 20 may be formed of a low resistance opaque conductive material such as aluminum (Al), an Al alloy, tungsten (W), copper (Cu), nickel (Ni), chrome (Cr), molybdenum (Mo), titanium (Ti), platinum (Pt), and tantalum (Ta). In addition, the emission control line 30 and the scan line 20 may have a multi-layered structure in which a transparent conductive material and an opaque conductive material are stacked such as indium-tin-oxide (ITO) and indium-zink-oxide (IZO).

After forming a conductive layer and a photoresist layer on an entire surface of the insulating layer 120, a photolithography process is performed to form a photoresist layer pattern on the conductive layer and an unnecessary part is removed by performing etching to form the emission control line 30 and the scan line 20.

The emission control line 30 and the scan line 20 may have a stacked or layered structure, for example, one selected from a double-layered structure in which a Mo layer is stacked on an Al layer, a double-layered structure in which the Mo layer is stacked on a Cu layer, a double-layered structure in which a Ti nitride layer or a Ta nitride is stacked on the Cu layer, and a double-layered structure in which the Ti nitride layer and the Mo layer are stacked or layered.

The emission control line 30 and the scan line 20 may be formed in the same layer and of the same material as the gate electrodes of the first to seventh TFTs (e.g., T1 to T7 of FIG. 2). Each of the gate electrode, the emission control line 30, and the scan line 20 for supplying signals may have a maximum thickness of 3,000 Å.

Figure 5D:
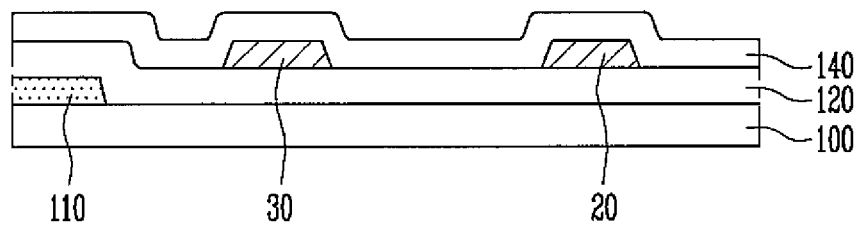

Referring to FIG. 5D, the gate insulating layer 140 is formed on the entire surface of the substrate 100 on which the emission control line 30 and the scan line 20 are formed. The gate insulating layer 140 is a single inorganic insulating layer such as a Si oxide layer, a Si oxide/nitride layer, a Si nitride/oxide layer, a Si nitride layer, and a Ta oxide layer or is formed by stacking inorganic insulating layers such as a Si oxide layer, a Si oxide/nitride layer, a Si nitride/oxide layer, a Si nitride layer, and a Ta oxide layer.

The gate insulating layer 140 is the inorganic insulating layer and has a smaller thickness than that of the emission control line 30 and that of the scan line 20 so that the gate insulating layer 140 is formed along the step difference of the emission control line 30 and the scan line 20.

Figure 5E:
Figure 5E:
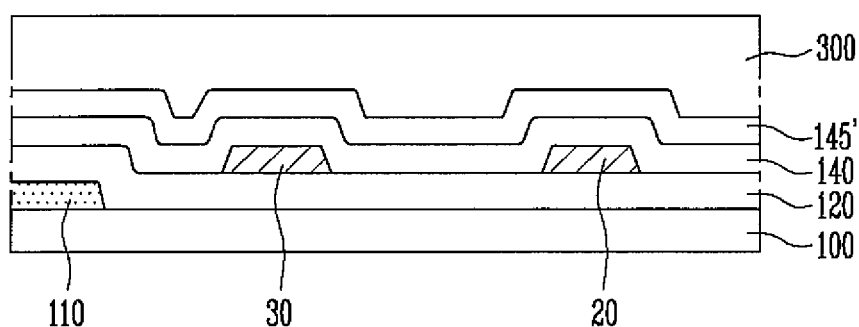
Figure 5F:
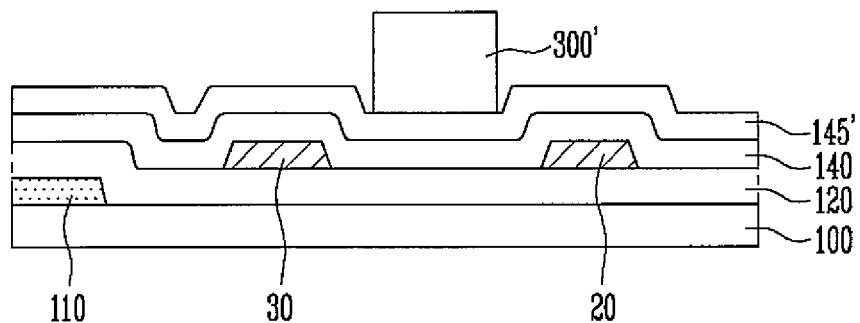

Referring to FIG. 5E, a conductive layer 145' is formed on the gate insulating layer 140 and a photoresist layer 300 is formed on the conductive layer 145'. A mask 200 including a transmitting unit A and a blocking unit B is arranged on the substrate 100 on which the photoresist layer 300 is formed to perform a series of mask processes such as exposure, development, and etching and to form a photoresist layer pattern 300' as illustrated in FIG. 5F. The photoresist layer pattern 300' overlaps a part of the conductive layer 145' between the emission control line 30 and the scan line 20 and the conductive layer 145' in which the photoresist layer pattern 300' is not formed is exposed to the outside.

Figure 5G:
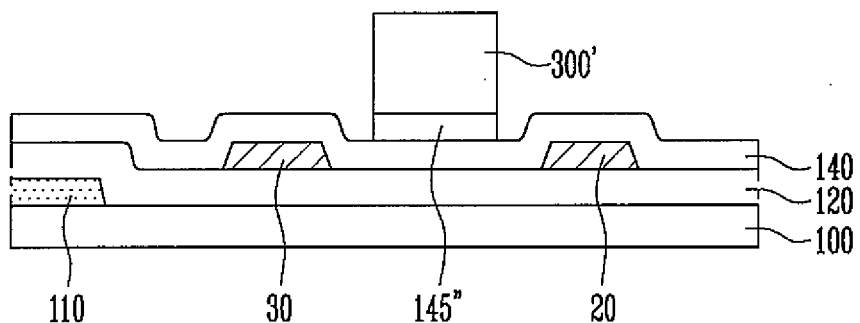
Figure 5H:
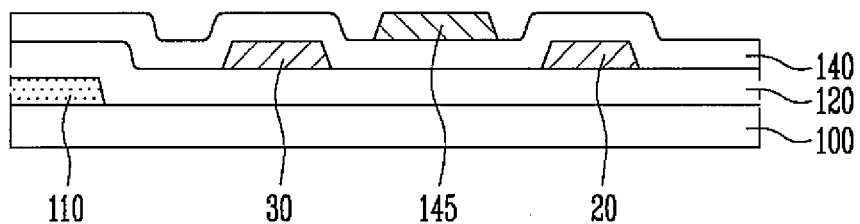

Referring to FIG. 5G, the conductive layer 145' exposed to the outside is removed by using the photoresist layer pattern 300' as an etching mask so that a conductive pattern 145" corresponding to the photoresist layer pattern 300' is formed. Then, the photoresist layer pattern 300' is removed by a strip process so that the step difference compensation pattern 145 is formed as illustrated in FIG. 5H.

The step difference compensation pattern 145 is formed on the gate insulating layer 140 between the emission control line 30 and the scan line 20. The step difference compensation pattern 145 functions as a floating electrode that does not affect the emission control line 30 and the scan line 20 arranged under the gate insulating layer 140.

The step difference compensation pattern 145 has a thickness of about 3,000 Å like the emission control line 30 and the scan line 20 and compensates for the step difference of the gate insulating layer 140 generated due to the thickness of the emission control line 30 and the thickness of the scan line 20.

The step difference compensation pattern 145 may be a single layer formed of a metal material such as molybdenum (Mo), titanium (Ti), chrome (Cr), tantalum (Ta), tungsten (W), aluminum (Al), copper (Cu), neodymium (Nd), and scandium (Sc) or an alloy material using the above metal materials as main components or may be formed by stacking layers formed of metal materials such as Mo, Ti, Cr, Ta, W, Al, Cu, Nd, and Sc or alloy materials using the above metal materials as main components.

In addition, the step difference compensation pattern 145 may have a single-layered structure of one selected from the group consisting of Mo, Ti, Ag, and an alloy of the above or a mixture of Mo, Ti, Ag, and the alloy of the above or a double-layered structure or a multi-layered structure of Mo, Al, or silver (Ag) that is a low resistance material in order to reduce line resistance.

That is, in order to reduce wiring line resistance, conductive layers of the multi-layered structure may be sequentially stacked like Mo/Al/Mo, MoW/Al/Nd/MoW, Mo/Ag/Mo, Mo/Ag alloy/Mo, or Ti/Al/Mo.

Figure 5I:
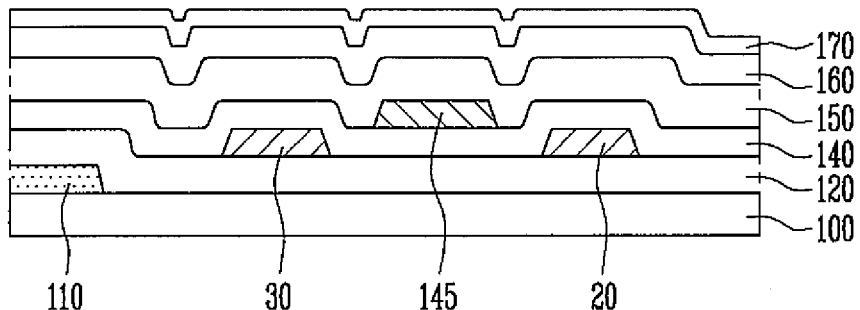

Referring to FIG. 5I, the first protective layer 150 and the second protective layer 160 are sequentially formed on the entire surface of the substrate 100 on which the step difference compensation pattern 145 is formed and the pixel electrode 170 may be formed on the second protective layer 160.

By way of summation and review, the plurality of TFTs, the gate wiring line, and the data wiring line are manufactured in the same process and are inevitably formed by stacking layers. Because the gate insulating layer positioned between the gate wiring line and the data wiring line is commonly formed of an inorganic insulating material and has a small thickness, the gate insulating layer is formed along the step difference of the gate wiring line. Therefore, the data wiring line is shorted in a location or portion in which the step difference is generated.

For example, the TFTs close to the boundary between the two adjacent pixels are shorted due to the step difference of the gate insulating layer so that a defect may be generated.

In addition, a valley generated due to the step difference is filled with an etching solution for etching the data wiring line so that the data wiring line may be excessively etched and the data wiring line may be shorted.

In the display device according to example embodiments of the present invention, the step difference compensation pattern is formed between the emission control line and the scan line so that the step difference of the gate insulating layer may be compensated for. In addition, it is possible to prevent or reduce instances of elements formed in a subsequent process from being shorted and to improve reliability of a product.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims, and their equivalents.

What is claimed is:

1. A display device comprising:
    a first wiring line and a second wiring line separated from each other on a substrate;
    a gate insulating layer on the first wiring line and the second wiring line;
    a step difference compensation pattern between the first wiring line and the second wiring line on the gate insulating layer;
    a protective layer on the step difference compensation pattern; and
    a pixel electrode on the protective layer.

2. The display device claim 1, wherein the step difference compensation pattern is in a floating state.

3. The display device of claim 1, wherein a thickness of the step difference compensation pattern is equal to a thickness of the first wiring line and a thickness of the second wiring line.

4. The display device of claim 1, wherein the step difference compensation pattern has a thickness in a range of 2,500 Å to 3,500 Å.

5. The display device of claim 1, further comprising a storage capacitor on the gate insulating layer.

6. The display device of claim 5, wherein the storage capacitor comprises:
    an upper storage electrode on the gate insulating layer and formed of a same material as the step difference compensation pattern; and
    a lower storage electrode under the gate insulating layer and overlapping the upper storage electrode.

7. The display device of claim 1, wherein the first wiring line comprises a scan wiring line configured to transmit a scan signal and the second wiring line comprises an emission control line configured to transmit an emission control signal.

8. The display device of claim 1, wherein the gate insulating layer comprises an inorganic insulating material.

* * * * *